United States Patent [19]

Ishida

[11] Patent Number: 5,519,736
[45] Date of Patent: May 21, 1996

[54] SYNCHRONOUS PSEUDO-NOISE CODE SEQUENCE GENERATION CIRCUIT

[75] Inventor: Kenji Ishida, Tokyo, Japan

[73] Assignee: NEC Corporation, Tokyo, Japan

[21] Appl. No.: 303,504

[22] Filed: Sep. 9, 1994

[30] Foreign Application Priority Data

Sep. 9, 1993 [JP] Japan ................................. 5-224243

[51] Int. Cl.⁶ ..................................................... H04L 7/00
[52] U.S. Cl. .......................... 375/367; 375/206; 364/717; 370/107; 331/78
[58] Field of Search ..................................... 375/200, 206, 375/367; 364/717; 331/78; 370/18, 19, 107; 380/46

[56] References Cited

U.S. PATENT DOCUMENTS

| | | | |
|---|---|---|---|
| 3,665,472 | 5/1972 | Kartchner et al. | 375/367 |
| 4,638,494 | 1/1987 | Kartchner et al. | 375/367 |
| 5,034,906 | 7/1991 | Chang et al. | 364/717 |
| 5,224,165 | 6/1993 | Reinhardt et al. | 364/717 |

FOREIGN PATENT DOCUMENTS 62-101137  5/1987  Japan .

*Primary Examiner*—Stephen Chin
*Assistant Examiner*—Don Vo
*Attorney, Agent, or Firm*—Young & Thompson

[57] ABSTRACT

A synchronous pseudo-noise (PN) code sequence generating circuit generates a plurality of PN code sequences which should be synchronized with each other. A feedback-type PN code generator generates a master PN code sequence. Each of N code converters, which are provided for each of N channels, converts the master PN code sequence to a PN code sequence of the corresponding channel in accordance with a mask pattern unique to the corresponding channel. The mask patterns for each channel are stored in the corresponding mask memory.

3 Claims, 3 Drawing Sheets

SYNCHRONOUS PSEUDO-NOISE CODE SEQUENCE GENERATION CIRCUIT

BACKGROUND OF THE INVENTION

This invention relates to a pseudo-noise (PN) code sequence generation circuit used in a spread spectrum communication system, and more particularly to the circuit for generating a plurality of PN code sequences which should be synchronized with each other.

As is well known in the art, a spread spectrum communication method has the following excellent features:

1) the power spectrum is low and signal secrecy can be ensured;
2) the disturbance to the other narrow band communication is small;
3) the resistance to disturbances is high; and
4) code division multiplexing is possible by using different PN code sequences in different channels.

In this method, data to be transmitted amplitude- or phase-modulates a carrier signal. The modulated signal is multiplied by a pseudo-noise code sequence generated by a PN code sequence generator to generate a spread signal. At the receiving side, the received spread signal is multiplied by a PN code sequence, which is the same as that used in the transmitting side, by a PN code sequence generator of the receiving side, whereby the modulated signal is reproduced.

It has been contemplated to apply the spread spectrum communication method to a mobile communication system. In mobile communication systems, a mobile base station of the system is fitted with a plurality (N) of PN code sequence generators each of which corresponds to a respective one of N channels.

FIG. 1 shows a block diagram of a conventional PN code sequence generator. As shown in FIG. 1, the conventional PN code sequence generator comprises m flip-flops (F/F) 11(1)–11(m) and n(<m) exclusive OR gates 12(1)–12(n) connected in accordance with a generation polynomial which determines a PN code sequence to be outputted. A respective preset signal is supplied to a clear signal input terminal or a set signal input terminal of each flip-flop, at a start time of each respective period of the PN code sequence. By the preset operation, the flip-flops are set to initial values, which also determine the PN code sequence to be outputted.

Since the operation of FIG. 1 is, for example, described in JP-A-62-101,137 (1987), no detailed explanation need be repeated here. However, it should be noted that the conventional PN code sequence generator has a structure with feedback paths. Therefore, if an erroneous signal is generated in elements of FIG. 1 due to noise or the like, the erroneous signal circulates in the loops of FIG. 1 and the generator outputs a PN code sequence other than the desired one, before new preset signals are supplied from outside of the generator.

Suppose that the conventional PN code sequence generator is applied to the mobile base station with a plurality of channels where PN code sequences of the channels have to be synchronized with each other. In this case, there will be a small problem if the PN code length, or period is short, because the next frame synchronization signal quickly reestablishes the synchronization state.

However, when the PN code period is long (i.e. $2^{42}-1$ chip clocks when m=42), the interval of the frame synchronization signal becomes long. Consequently, if a PN code sequence of a specified channel errs due to noise or the like, it loses synchronization with the other channels and an asynchronized state of the specified channel continues for a long time because the interval of the PN code sequence is long. The asynchronization state makes inverse-diffusing of the received spread signal to the reproduced modulation signal impossible for a long time at the receiving side.

SUMMARY OF THE INVENTION

It is therefore a principal object of the invention to provide a synchronous pseudo-noise code sequence generation circuit which reestablishes synchronization of PN code sequences quickly even when the period of the PN code sequences is long.

According to the invention, there is provided a synchronous pseudo-noise (PN) code sequence generation circuit for producing first to Nth PN code sequences for N channels, comprising:

a master PN code sequence generator for generating a master PN code sequence;

first to Nth mask memories for storing first to Nth mask patterns unique to each of said N channels, respectively; and first to Nth feed forward-type converters connected to the first to Nth mask memories, respectively, for converting the master PN code sequence to the first to Nth PN code sequences, respectively, in accordance with the first to Nth mask patterns, respectively.

DETAILED DESCRIPTION OF THE INVENTION

Figure 2:
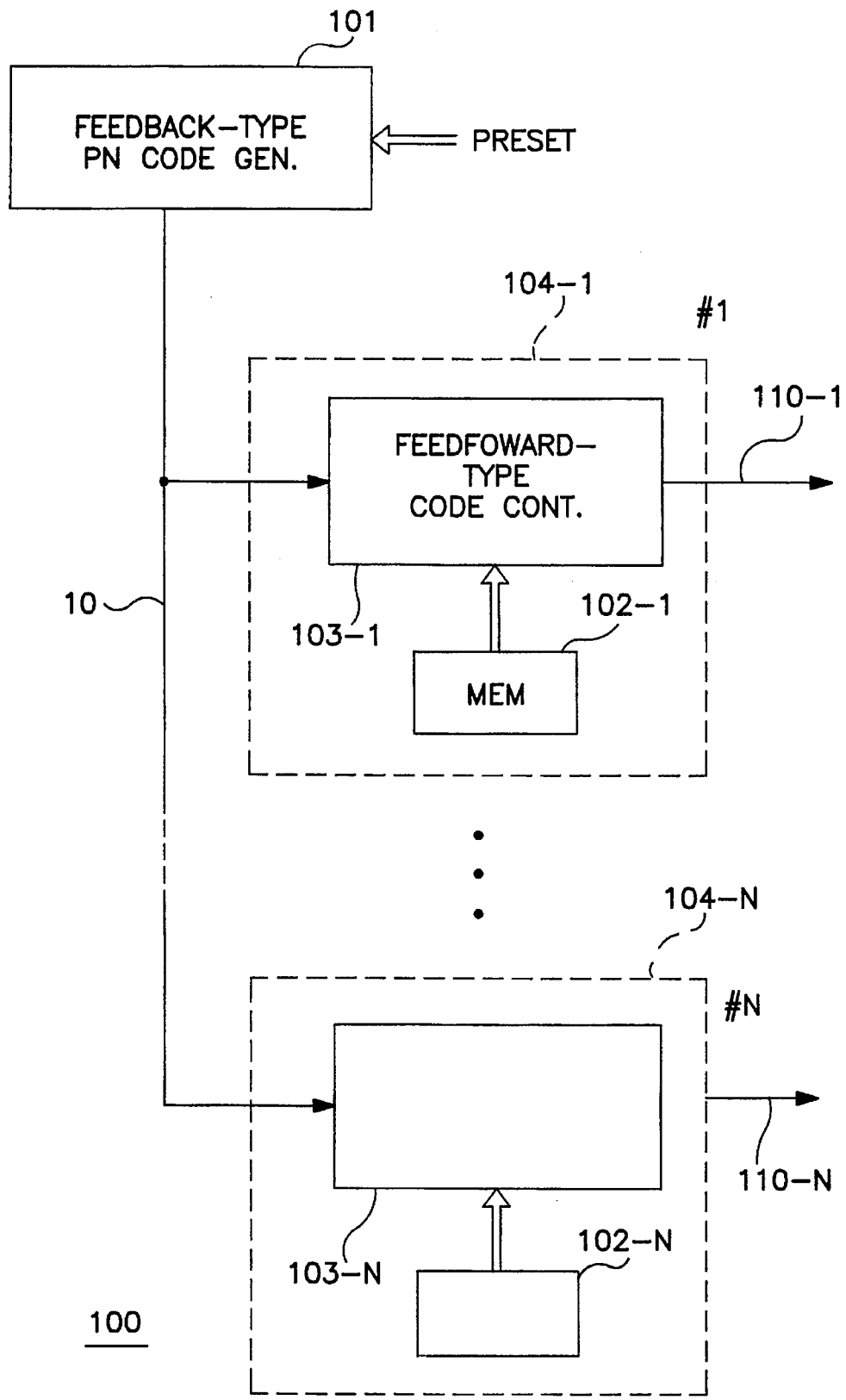
FIG. 2 shows a block diagram of a preferred embodiment of the invention.

Referring to FIG. 2, a preferred embodiment of the invention is hereinafter described.

As shown in FIG. 2, the preferred embodiment of the invention includes:

a feedback-type PN code sequence generator 101 for generating a master PN code sequence 10; and N code generators 104-1, . . . , 104-N responsive to the master PN code sequence 10 for converting the master PN code sequence to N PN code sequences in accordance with N m-bit parallel predetermined mask patterns each of which is unique to each of the code generators, respectively.

Each of code generators 104-1 to 104-N includes a mask memory for storing one of the N m-bit parallel predetermined mask patterns and a feed forward-type code converter for converting the master PN code sequence to a PN code for each channel in accordance with the corresponding parallel predetermined mask pattern.

Figure 1:
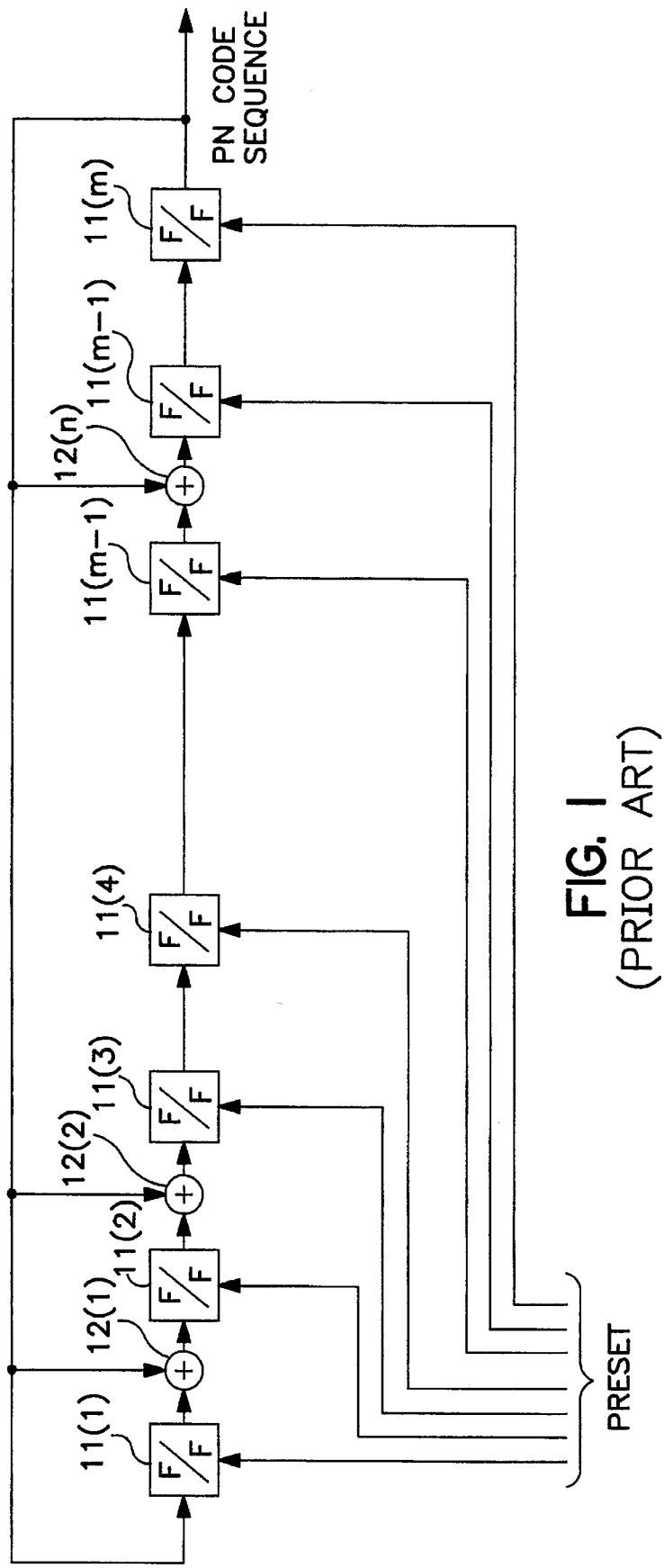
FIG. 1 shows a block diagram of a conventional PN code sequence generator.

The detailed embodiment and the operation of the feedback-type PN code sequence generator 101 may be the same as that of the conventional PN code sequence generator of FIG. 1. In accordance with the preset signals which are supplied at the start time of each frame of data to be transmitted, the feedback-type PN code generator 101 outputs the master PN code sequence 10.

Since the feed forward-type code converters 104-1 to 104-N are substantially identical to each other in their operations, only the code converter 104-1 is explained hereinafter.

The code converter 104-1 receives the master PN code sequence 10 and converts it to a PN code sequence 110-1 for channel #1 by modifying the master PN code sequence according to the parallel predetermined mask pattern, which is unique to the channel #1, from the mask memory 102-1.

Figure 3:
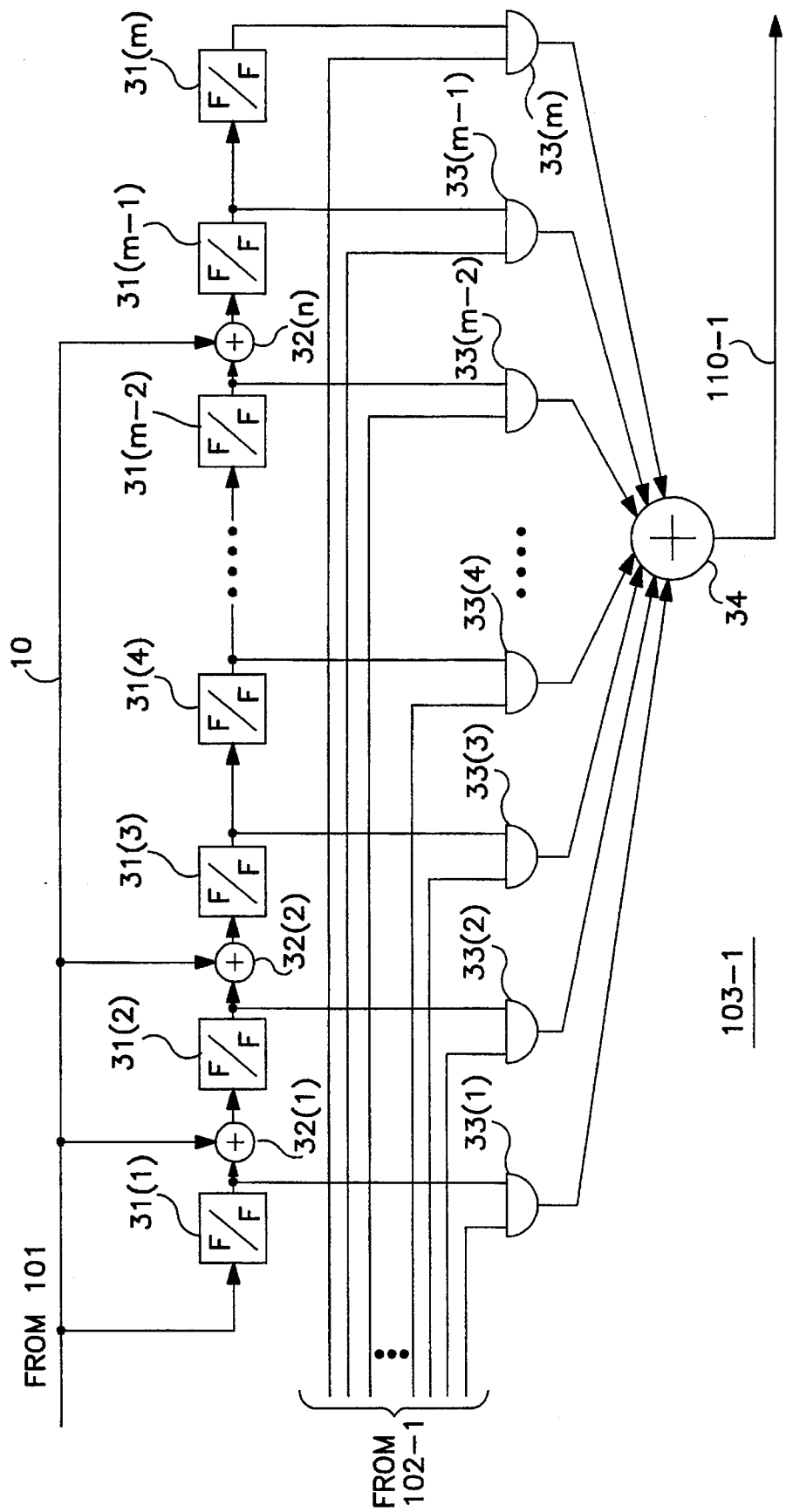
FIG. 3 shows a block diagram of a detailed embodiment of a feed forward-type converter 104-1 of FIG. 2.

Referring to FIG. 3, the detailed embodiment and operation of the feed forward-type code converter (hereinafter referred to as "converter") 103-1 will now be described.

As shown in FIG. 3, the converter 103-1 includes m flip-flops 31(1)–31(m) and n exclusive OR gates 32(1)–32(n). These elements may be connected in the same manner as in FIG. 1, except that the master PN code sequence 10 is inputted to the flip-flop 31(1) and second input terminals of the exclusive OR gates 32(1)– 32(n) and the converter 103-1 has a feed-forward structure with no feedback path.

The converter 103-1 further includes AND gates 33(1)–33(m) each for passing the outputs of the flip-flops 31(1)–31(m) in accordance with the corresponding bit of the m-bit parallel predetermined mask pattern, respectively and an adder 34 for modulo 2 adding the outputs of the flip-flops 31(1)–31(m) and outputting the PN code sequence for channel #1.

In the converters 103-1 to 103-N, insertion positions of the exclusive OR gates in a series of the flip-flops 31(1)–31(m) determine the conversion from the master PN code sequence to the PN code sequences 110-1 to 110-N for each channel. Of course, the mask pattern from the mask memories 102-1 to 102-N also determines the conversion.

Next, operations of the converter 103-1 are explained.

The master PN code sequence 10 is inputted to the flip-flop 31(1) and the second input terminals of the exclusive OR gates 32(1)–32(n). By the operation of a combination of the flip-flops and the exclusive OR gates, the master PN code sequence is modified, or scrambled. Outputs of the flip-flops 31(1)–31(m) are inputted to first input terminals of the AND gates 33(1)–33(m), respectively.

To second terminals of the AND gates 33(1)–33(m) each bit of an m-bit parallel mask pattern stored in the mask memory 102-1 is outputted, respectively. The AND gates 33(1)–33(m) convert the outputs of the flip-flops 31(1)–31(m) in accordance with the corresponding bit of the m-bit parallel mask pattern and supply the converted results to the adder 34. The mask memory may be fabricated by m wires which are supplied with a high or low level if the mask pattern is fixed for each channel. Otherwise, it may be constituted by read-only-memory (ROM) or the like.

The adder 34 modulo-2-adds the outputs of the flip-flops to output the PN code sequence 110-1 for channel #1.

As suggested before, the code generators 104-1 to 104-N may be different from each other in connections among flip-flops and exclusive OR gates and mask pattern stored in the mask memories. Therefore, the embodiment of FIG. 2 generates N PN code sequences for channels #1–#N.

Now it should be noted that all the code generators 104-1 to 104-N include no feedback path. Consequently, an erroneous signal generated in the code generators due to noises or the like does not provide an erroneous channel with a long asynchronization state because the erroneous signals disappear within m chip clock time in the code generators and do not circulate therein at all. In other words, the erroneous channel returns to a synchronization state within at most m chip clock time.

As described in detail above, the present invention provides a synchronous PN code sequence generation circuit which reestablishes synchronization of the PN code sequences to be outputted quickly even when a long PN code sequence period is used.

Although the invention has been described in detail above in connection with various preferred embodiments thereof, it will be appreciated by those skilled in the art that these embodiments have been provided solely for purposes of illustration, and are in no way to be considered as limiting the invention. Instead, various modifications and substitutions of equivalent techniques will be readily apparent to those skilled in the art upon reading this specification, and such modifications and substitutions are to be considered as falling within the true scope and spirit of the following claims.

I claim:

1. A synchronous pseudo-noise (PN) code sequence generation circuit for producing first to Nth PN code sequences for N channels, comprising:

a master PN code sequence generator for generating a master PN code sequence;

first to Nth mask memories for storing first to Nth parallel predetermined mask patterns unique to each of said N channels, respectively; and first to Nth feed forward-type converters connected to said first to Nth mask memories, respectively, for converting said master PN code sequence to said first to Nth PN code sequences, respectively, in accordance with said first to Nth parallel predetermined mask patterns, respectively.

2. The synchronous pseudo-noise (PN) code sequence generation circuit, as claimed in claim 1, wherein each of said first to Nth feed forward-type converters comprises:

a plurality n of exclusive OR gates having first and second input terminals, to the first input terminal of which said master PN code sequence is supplied;

a plurality m of flip-flops connected in series, wherein m is greater than n, with said plurality n of exclusive OR gates being inserted between selected adjacent pairs of said plurality m of flip-flops such that the second input of each exclusive OR gate is connected to an output of one of an adjacent pair of flip-flops and an output of each exclusive OR gate is connected to an input of the other of said adjacent pair of flip-flops;

a plurality m of gates having first inputs supplied with respective outputs of said plurality m of flip-flops, respectively, and second inputs supplied with each bit of said parallel predetermined mask pattern, respectively; and an adder for modulo-2-adding outputs of said m gates and outputting one of said first to Nth PN code sequences.

3. The synchronous pseudo-noise code sequence generation circuit as claimed in claim 2, wherein said first to Nth memories consist of signal wires.

* * * * *